United States Patent
Ke et al.

(10) Patent No.: US 9,685,334 B1
(45) Date of Patent: Jun. 20, 2017

(54) METHODS OF FORMING SEMICONDUCTOR FIN WITH CARBON DOPANT FOR DIFFUSION CONTROL

(71) Applicant: GLOBALFOUNDRIES INC., Grand Cayman (KY)

(72) Inventors: Yue Ke, Arlington, MA (US); Mohammad Hasanuzzaman, Beacon, NY (US); Benjamin G. Moser, Malta, NY (US); Shahrukh A. Khan, Danbury, CT (US); Sean M. Polvino, Watertown, MA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/134,917

(22) Filed: Apr. 21, 2016

(51) Int. Cl.
*H01L 21/225* (2006.01)
*H01L 21/02* (2006.01)
*H01L 29/66* (2006.01)

(52) U.S. Cl.
CPC .... *H01L 21/2254* (2013.01); *H01L 21/02527* (2013.01); *H01L 21/02592* (2013.01); *H01L 29/66795* (2013.01)

(58) Field of Classification Search
CPC ........... H01L 21/2254; H01L 21/02527; H01L 21/02592; H01L 29/66795
See application file for complete search history.

(56) References Cited

U.S. PATENT DOCUMENTS

| | | | |
|---|---|---|---|
| 8,476,706 B1* | 7/2013 | Chidambarrao | .... H01L 21/8238 257/338 |
| 9,082,698 B1* | 7/2015 | Joshi | ................. H01L 29/66795 |
| 9,087,860 B1* | 7/2015 | Banghart | .......... H01L 29/66803 |
| 2015/0123166 A1* | 5/2015 | Jacob | .................... H01L 29/785 257/192 |
| 2016/0086858 A1* | 3/2016 | Cheng | ............... H01L 21/82382 257/618 |
| 2016/0240651 A1* | 8/2016 | Lee | ........................ H01L 29/785 |
| 2016/0379981 A1* | 12/2016 | Balakrishnan | ...... H01L 27/0924 257/192 |

* cited by examiner

*Primary Examiner* — Errol Fernandes
(74) *Attorney, Agent, or Firm* — Yuanmin Cai; Hoffman Warnick LLC

(57) ABSTRACT

Methods of forming a semiconductor fin and methods for controlling dopant diffusion to a semiconductor fin are disclosed herein. The methods provide alternative ways to incorporate a carbon dopant into the fin to later control out-diffusion of dopants from a dopant-including epitaxial layer. One method includes depositing a carbon-containing layer over a portion of the fin adjacent to the gate and annealing to diffuse carbon from the carbon-containing layer into at least the portion of the semiconductor fin. This method can be applied to SOI or bulk semiconductor substrates. Another method includes epitaxially growing a carbon dopant containing semiconductor layer for later use in forming the fin.

19 Claims, 8 Drawing Sheets

METHODS OF FORMING SEMICONDUCTOR FIN WITH CARBON DOPANT FOR DIFFUSION CONTROL

BACKGROUND

Technical Field

The present disclosure relates to semiconductor device fabrication, and more specifically, to methods of forming a semiconductor fin, or a finFET including the semiconductor fin, with a carbon dopant therein for limiting dopant diffusion in the fin.

Related Art

Fin-type field effect transistors (finFET) are used widely in advanced complementary metal-oxide semiconductor (CMOS) technologies. During finFET fabrication, a semiconductor fin is formed and a gate is formed perpendicular across the semiconductor fin. An epitaxial layer including n-type or p-type dopant is formed on the fin adjacent the gate, and an anneal is performed to diffuse the dopants from the epitaxial layer into a source/drain regions of the fin adjacent the gate and, to a lesser degree, a channel region of the fin under the gate. The dopants create the source/drain regions and a channel under the gate in the semiconductor fin that allow the finFET to operate.

One challenge in fabricating a finFET and other three-dimensional CMOS devices is controlling the concentration of dopant diffused from the dopant providing epitaxial layer, e.g., into the channel region and the source and drain regions of a finFET. One approach to controlling the dopant diffusion is introducing a carbon dopant by ion implantation, e.g., into the fin adjacent the channel region. Carbon has proven to be very effective to limit boron (B)(p-type) and phosphorus (P)(n-type) dopant diffusion in silicon. However, introducing a conformal carbon dopant is becoming more difficult in a number of ways. With respect to finFETs and other three-dimensional structures, carbon doping by conventional ion implantation is challenging because non-planer structures block the implant beam, especially at smaller technology nodes such as those with wire dimensions below 10 nanometers. As a result, carbon ion implant doping is not uniform across a semiconductor fin, comparing for example a top of the fin to a side of the fin. This non-uniform carbon doping causes non-uniform dopant out-diffusion from the conformal epitaxial layer between the top of the fin versus sides of the fin in three-dimensional structures, which creates a number of issues for smaller device features. One issue includes drain-induced barrier loading (DIBL), which refers to the reduction of threshold voltage at which the FET turns on caused by the shorter distances between source and drain regions, i.e., short channel effects. Another issue for bulk substrates includes ensuring device isolation between adjacent finFETs.

SUMMARY

A first aspect of the disclosure is directed to a method for controlling dopant diffusion to a semiconductor fin having a first portion, the method comprising: depositing a carbon-containing layer over a second portion of the semiconductor fin adjacent to the gate, the second portion distinct from the first portion; first annealing to diffuse carbon from the carbon-containing layer into at least the second portion of the semiconductor fin; removing the carbon-containing layer over the second portion of the semiconductor fin; growing a dopant-containing epitaxial layer over the second portion of the semiconductor fin; and second annealing to diffuse dopant from the dopant-containing epitaxial layer into at least the second portion of the semiconductor fin, the carbon in the second portion of the semiconductor fin limiting diffusion of the dopant into at least the second portion of the semiconductor fin.

A second aspect of the disclosure includes a method for controlling dopant diffusion to a semiconductor fin having a gate extending over a first portion thereof, the method comprising: forming the semiconductor fin from a bulk semiconductor substrate; forming the gate over the first portion of the semiconductor fin; removing a section of a second portion of the semiconductor fin adjacent to the gate; depositing a carbon-containing layer over a remaining section of the second portion of the semiconductor fin adjacent to the gate; performing a first annealing to diffuse carbon from the carbon-containing layer into at least the second portion of the semiconductor fin; removing the carbon-containing layer over the second portion of the semiconductor fin adjacent to the gate; growing a dopant-containing epitaxial layer over the second portion of the semiconductor fin adjacent to the gate, filling at least part of the section removed from the second portion in the semiconductor fin adjacent to the gate; and performing a second annealing to diffuse dopant from the dopant-containing epitaxial layer into at least the second portion of the semiconductor fin adjacent the gate, the carbon in the second portion of the semiconductor fin adjacent to the gate limiting diffusion of the dopant into at least the second portion of the semiconductor fin adjacent the gate.

A third aspect of the disclosure related to a method of forming a semiconductor fin, the method comprising: epitaxially growing a carbon-doped semiconductor layer on a semiconductor substrate; epitaxially growing a semiconductor layer on the carbon-doped semiconductor layer; and forming the semiconductor fin from the carbon-doped semiconductor layer on the semiconductor substrate and the semiconductor layer on the carbon-doped semiconductor layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Methods of forming a semiconductor fin and methods for controlling dopant diffusion to a semiconductor fin are disclosed herein.

Figure 1:
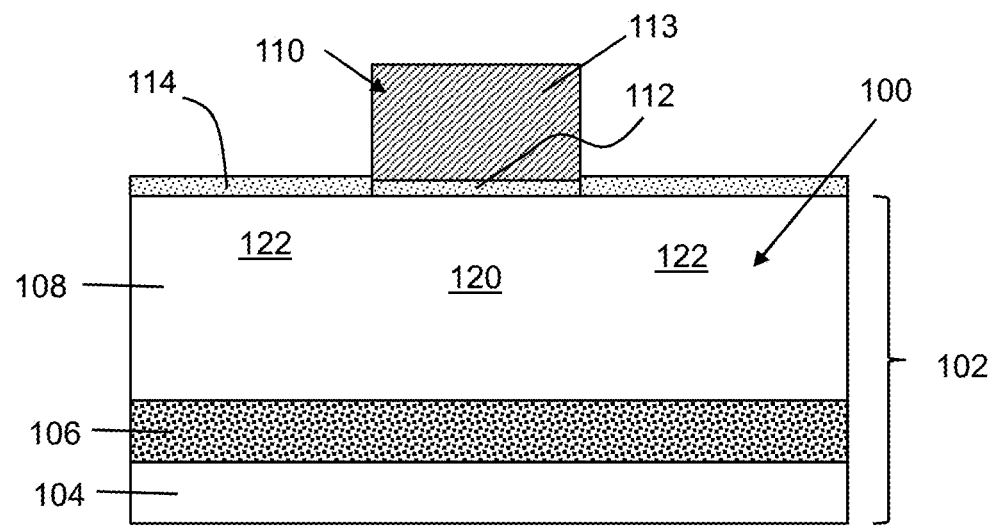
FIGS. 1-6 show cross-sectional views of methods of forming a semiconductor fin on a semiconductor-on-insulator (SOI) substrate according to embodiments of the invention.
Figure 2:
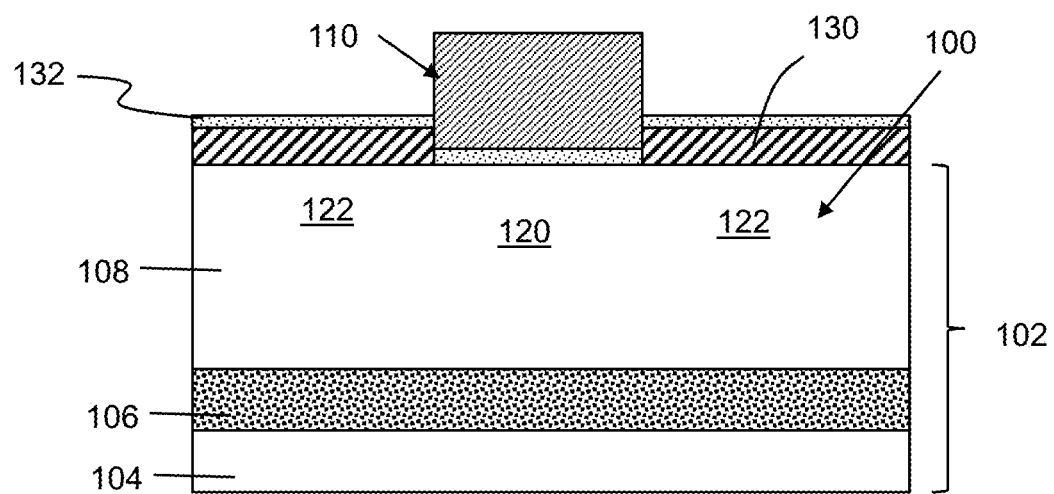
Figure 3:
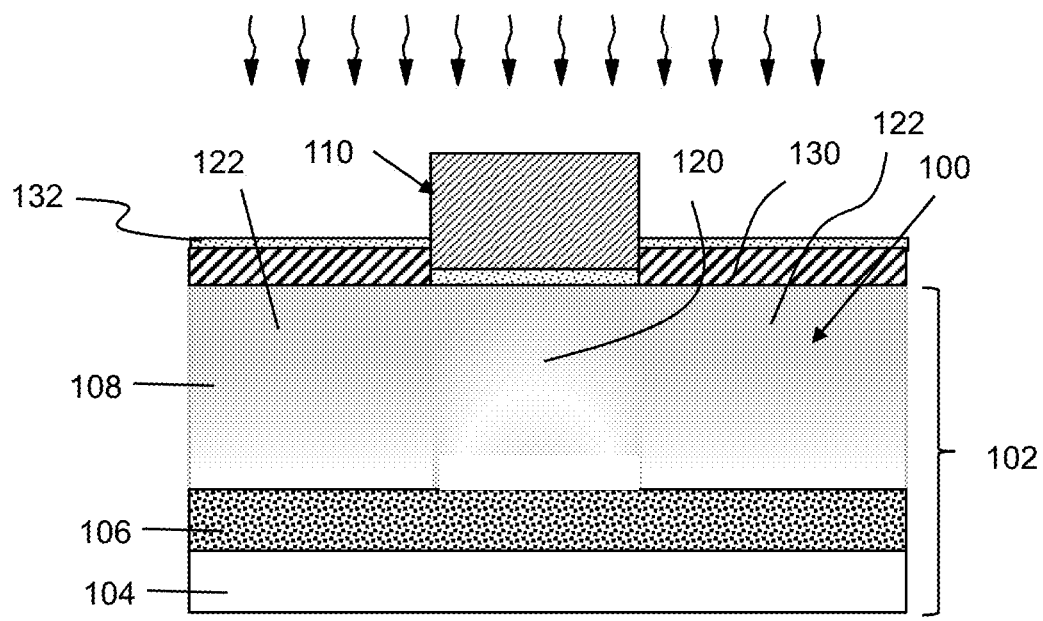
Figure 4:
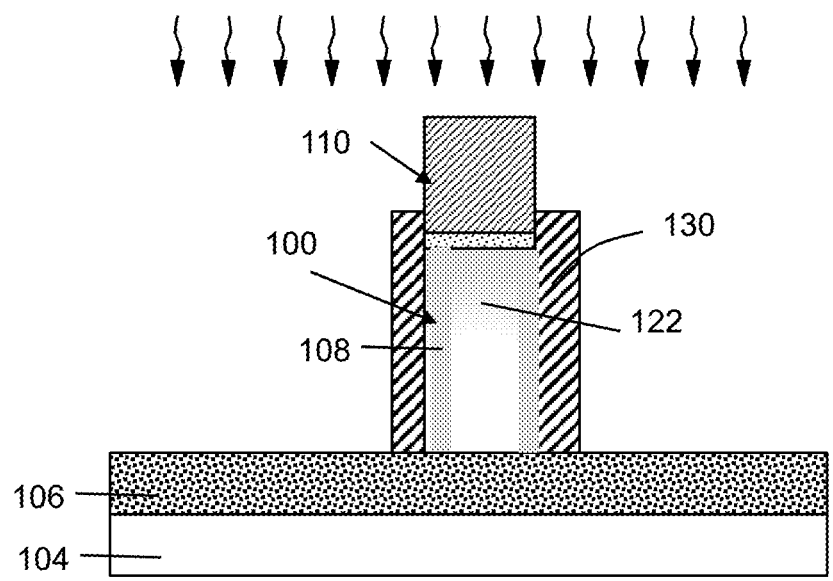
Figure 5:
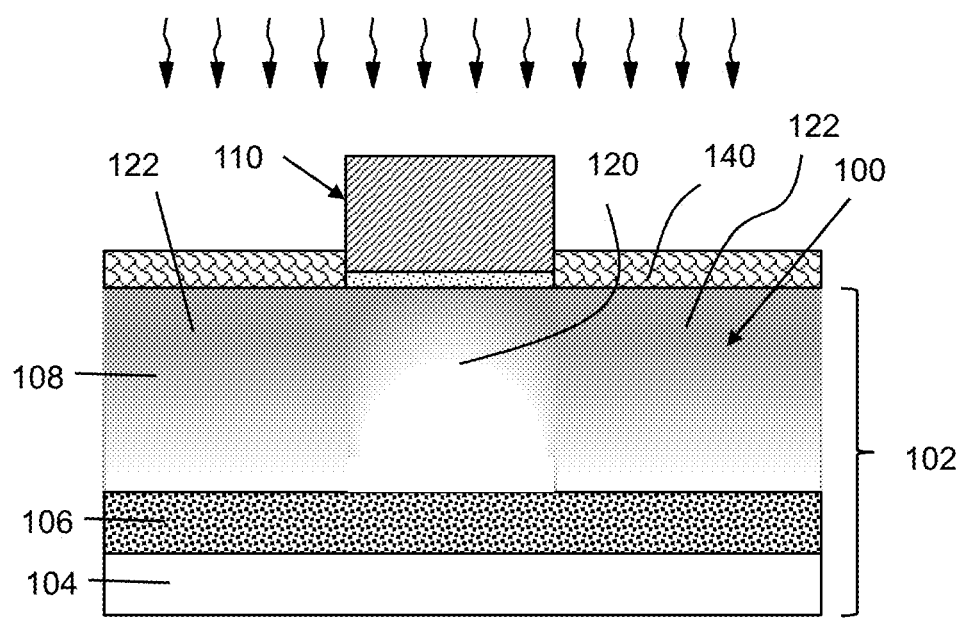
Figure 6:
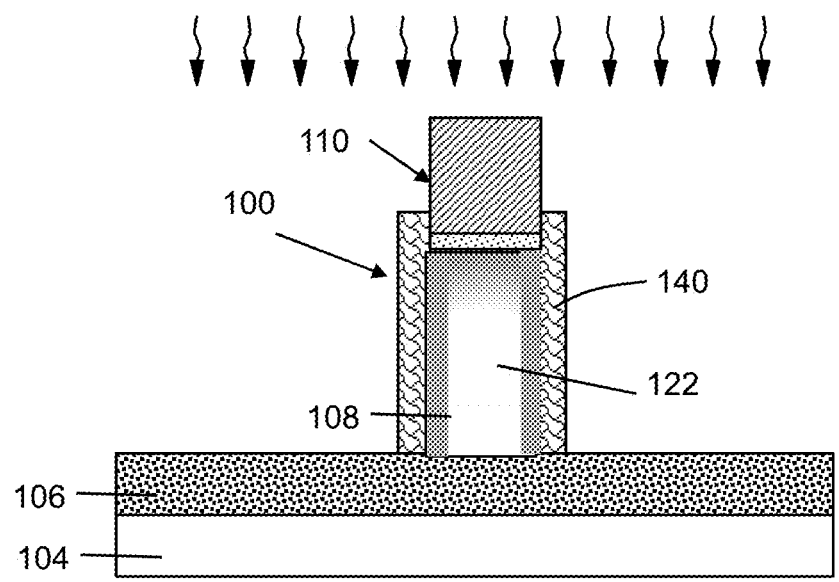
Figure 7:
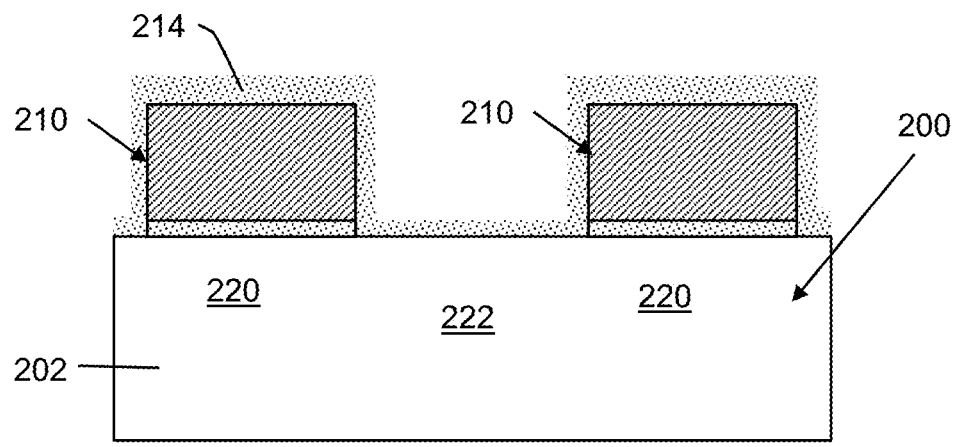
FIGS. 7-12 show cross-sectional views of methods of forming a semiconductor fin on a bulk semiconductor substrate according to embodiments of the invention.

FIGS. 1-6 show cross-sectional views of methods for controlling dopant diffusion to a semiconductor fin 100 on a semiconductor-on-insulator (SOI) substrate 102 according to embodiments of the invention. FIGS. 1-3 and 5 show a cross-section through a gate 110, and FIGS. 4 and 6 show a cross-section through semiconductor fin 100. Semiconductor-on-insulator (SOI) technology typically refers to the use of a layered semiconductor-insulator-semiconductor substrate in place of a more conventional bulk semiconductor substrate in semiconductor manufacturing, especially microelectronics. SOI-based devices differ from conventional bulk semiconductor-built devices in that the silicon junction is above an electrical insulator, typically silicon dioxide or (less commonly) sapphire. As shown in FIG. 1, SOI substrate 102 includes a semiconductor substrate 104, an insulator layer 106 and a semiconductor-on-insulator layer 108. The choice of insulator layer 106 material depends largely on intended application, with sapphire being used for radiation-sensitive applications and silicon oxide preferred for improved performance and diminished short channel effects in microelectronics devices. The precise thickness of insulator layer 106 and topmost semiconductor-on-insulator (SOI) layer 108 also vary widely with the intended application. Semiconductor substrate 104 and SOI layer 108 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire portions of SOI layer 108 and semiconductor substrate 104 may be strained. SOI layer 108 and semiconductor substrate 104 need not include the same material.

As shown in FIG. 1, SOI layer 108 has been formed into semiconductor fin 100, and a gate 110 has been formed over a first portion 120 of the fin. As understood in the art, gate 110 extends into and out of the page, and first portion 120 eventually provides a channel of a fin-type field effect transistor (finFET) formed using semiconductor fin 100. Semiconductor fin 100 may be formed using any now known or later developed photolithographic technique, e.g., depositing a photoresist on SOI layer 108, patterning the photoresist into a mask by exposing it and etching it, etching SOI layer 108 using the mask so formed and then removing the mask. Gate 110 may be formed using any now known or later developed processing, e.g., depositing a gate material, depositing a photoresist on the gate material, patterning the photoresist into a mask by exposing it and etching it, etching the gate material using the mask so formed and then removing the mask. Gate 110 may be a dummy gate including a sacrificial material, e.g., polysilicon, used to prevent damage to the final gate that replaces it, e.g., a metal, or gate 110 may include the actual gate material, e.g., metal. Gate 110 may also include a gate dielectric 112, e.g., silicon oxide, under a body 113 thereof. A cap layer 114 of, e.g., silicon nitride ($Si_3N_4$), may also optionally be formed over a second portion 122 of semiconductor fin 100 adjacent to gate 110, e.g., by deposition thereon.

"Depositing" or "deposition" as used herein may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. "Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

FIG. 2 shows depositing a carbon-containing layer 130 over a second portion 122 of semiconductor fin 100 adjacent to gate 110. As understood in the art, second portion 122 eventually becomes a source/drain region(s) of a finFET formed using semiconductor fin 100 by diffusing either p-type dopants or n-type dopants into second region 122, depending on the type of finFET desired. As illustrated, cap layer 114 (FIG. 1) may be removed from second portion 122 of semiconductor fin 100 adjacent to gate 110 prior to depositing carbon-containing layer 130 over second portion 122 of semiconductor fin 100 adjacent to the gate. Cap layer 114 may be removed using any appropriate etching process, e.g., RIE. In one embodiment, carbon-containing layer 130 includes amorphous carbon deposited using ALD, but it could be any conformal carbon-containing layer. FIG. 2 also shows an optional step of forming a cap layer 132, e.g., silicon oxide ($SiO_2$) or silicon nitride, over carbon-containing layer 130, e.g., by depositing the layer.

FIGS. 3 and 4 show annealing (represented by arrows) to diffuse carbon from carbon-containing layer 130 into at least second portion 122 of semiconductor fin 100. The annealing can include, for example, a rapid thermal anneal (RTA) or a laser sintered anneal (LSA). The temperature and duration of the anneal can be controlled to control the amount of carbon diffused from carbon-containing layer 130 and the distance carbon is diffused into semiconductor fin 100; hence, the carbon may diffuse at least into second portion 122 and perhaps to some degree into first portion 120. Generally, the higher the temperature and the longer the duration, the more carbon that is diffused into the fin. As illustrated, second portion 122 adjacent gate 110 in semiconductor fin 110 has a larger concentration of carbon diffused therein compared to first portion 120, i.e., due to the distance the diffused carbon has to travel to reach first portion 120. In one embodiment, annealing occurs at a temperature between approximately 600° C. to approximately 1000° C. Further, depending on the anneal process used, the duration may be between approximately 1 millisecond, e.g., for LSA, and approximately 60 minutes, e.g., for RTA. The anneal temperature and duration may vary widely depending on the amount of dopant diffusion limiting that is desired.

FIGS. 5 and 6 show semiconductor fin 100 after removing carbon-containing layer 130 (FIG. 4) over second portion 122 of semiconductor fin 100 adjacent to gate 110. Cap layer 132 would also be removed, if provided, prior to removing carbon-containing layer 130 over second portion 122 of semiconductor fin 100. Carbon-containing layer 130 and/or cap layer 132 may be removed using any appropriate etching process, as provided herein, e.g., RIE.

FIGS. 5 and 6 also show growing a dopant-containing epitaxial layer 140 over second portion 122 of semiconductor fin 100 adjacent to gate 110. The terms "epitaxial growth" and "epitaxially formed and/or grown" mean the growth of a semiconductor material on a deposition surface of a semiconductor material, e.g., second portion 122 of semiconductor fin 100, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of semiconductor fin 100 with sufficient energy to move around on the surface and orient themselves to the crystal arrangement of the atoms of the fin. Therefore, an epitaxial semiconductor material may have the same crystalline characteristics as the deposition surface, here fin 100, on which it may be formed. For example, an epitaxial semiconductor material deposited on a {100} crystal surface may take on a {100} orientation. In some embodiments, and as illustrated here, epitaxial growth processes may be selective to forming on semiconductor surfaces, and may not deposit material on other surfaces such as gate 110 or other surfaces of materials like silicon dioxide or silicon nitride surfaces. For example, where spacers (not shown) are provided. Dopants provided in dopant-containing epitaxial layer 140 may include any appropriate p-type (acceptors) or n-type (donors) dopants for forming source/drain regions of a finFET. For example, common dopants in silicon for p-type include: boron (B) and/or indium (In), and for n-type include: phosphorous (P), arsenic (As) and/or antimony (Sb). Dopants may be provided in epitaxial layer 140 in-situ, i.e., as layer 140 is formed in an epitaxy process chamber.

FIGS. 5 and 6 also show annealing (represented by arrows) to diffuse dopant from dopant-containing epitaxial layer 140 into at least second portion 122 of semiconductor fin 100 adjacent gate 110—note change in shading of fin 100. As indicated, dopants from epitaxial layer 140 enter second portions 122, i.e., source/drain regions, and some may also enter first portion 120, e.g., the channel. Carbon in second portion 122 of semiconductor fin 100 adjacent to gate 110 limits diffusion of the dopant, e.g., phosphorous or boron, into at least second portion 122, and perhaps some of first portion 120, of semiconductor fin 100. That is, dopant may diffuse into second portion 122 and perhaps to some degree into first portion 120. In contrast to conventional ion implantation of carbon, the techniques described herein provide a more uniform introduction of carbon and thus better diffusion control. Further, the technique can be applied where ion implantation is no longer viable, e.g., the 14 nanometer technology node and beyond.

FIGS. 7-11 show cross-sectional views of methods of forming a semiconductor fin 200 on a bulk semiconductor substrate 202 according to embodiments of the invention. This method is somewhat similar to that shown in FIGS. 1-6 except semiconductor fin 200 is formed from a bulk semiconductor substrate 202. Bulk semiconductor substrate 202 may include any of the semiconductor materials listed herein and semiconductor fin 200 may be formed as described relative to semiconductor fin 100 in FIG. 1. A gate 210 may also be formed over a first portion 220 (channel) of semiconductor fin 200. In FIGS. 7-11, two adjacent gates 210 are shown. Gate(s) 210 may be formed and may include the materials as stated relative to the FIGS. 1-6 embodiment. A cap layer 214, similar to cap layer 114 (FIG. 1) may be optionally provided over gate(s) 210 and semiconductor fin 200.

Figure 8:
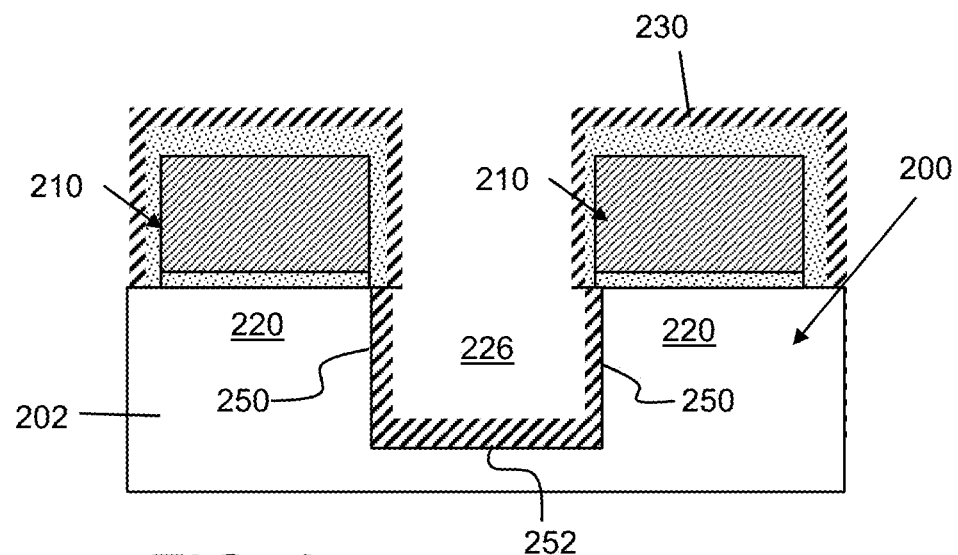

FIG. 8 shows removing a section of a second portion 222 (FIG. 7) of semiconductor fin 200 adjacent to gate 210. As illustrated, a section of second portion 222 is removed from between gates 210, along with any cap layer 214, leaving a remaining section of second portion 222. The section of second portion 222 may be removed using any etching process described herein, e.g., RIE, resulting in a recess 226 in semiconductor fin 200. Any necessary masking may be provided to protect remaining gate(s) 210 and cap layer 214. After the section removal, a (recessed) remaining section of second portion, shown as a recess 226, of semiconductor fin 200 includes exposed sidewalls 250 and a bottom 252 of recess 226. FIG. 8 also shows depositing a carbon-containing layer 230 over recessed (remaining section) second portion 226 of semiconductor fin 200 adjacent to gate 210, i.e., within the recess and coating sidewalls 250 and bottom 252. Carbon-containing layer 230 may include amorphous carbon. A cap layer (not shown for clarity), e.g., of silicon nitride, may also optionally be deposited over carbon-containing layer 230.

Figure 9:
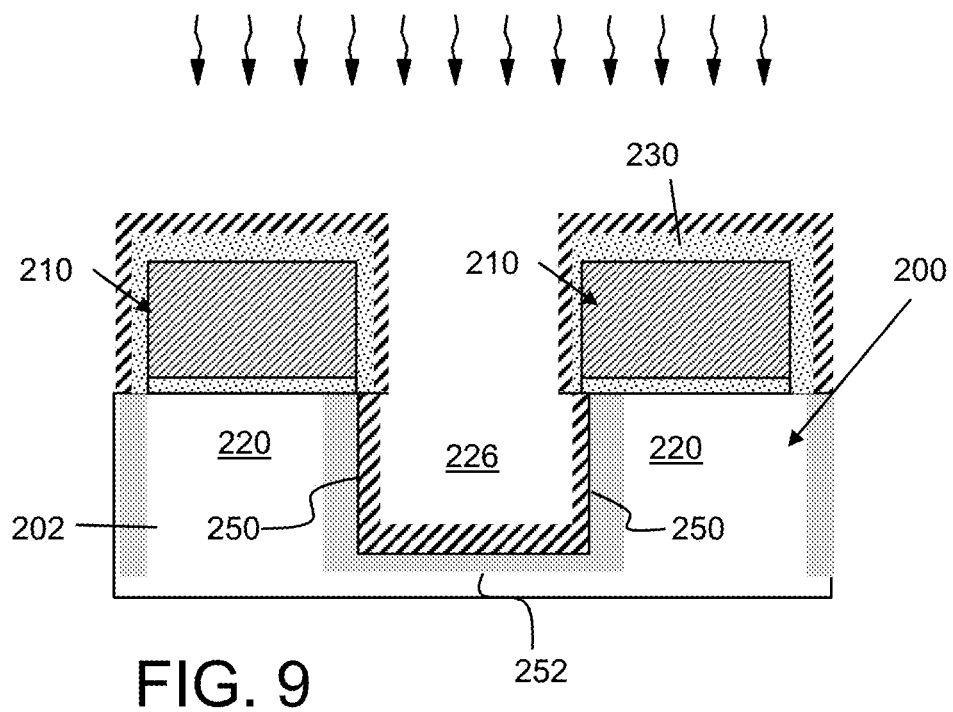

FIG. 9 shows annealing (represented by arrows) to diffuse carbon from carbon-containing layer 230 into at least second portion of semiconductor fin 200, i.e., sidewalls 250 and bottom 252 of recess 226 and perhaps some of first portion. As described herein, the annealing can be controlled to control the amount of carbon diffused into semiconductor fin 200.

Figure 10:
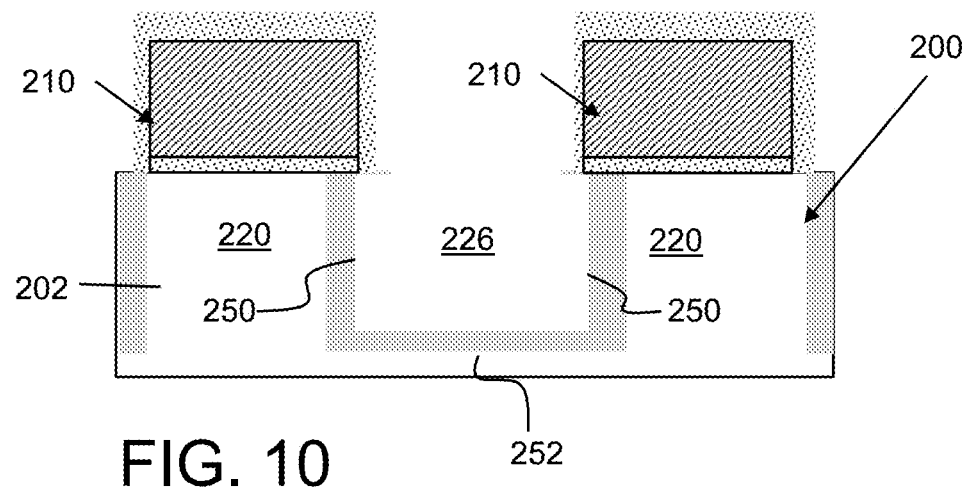

FIG. 10 shows removing carbon-containing layer 230 (FIG. 9) over the second portion of semiconductor fin 200 adjacent to gate 210. Any cap layer provided would be removed prior to removing layer 230. As shown, carbon-containing layer 230 and any cap layer may be removed everywhere by any appropriate etching process described herein, i.e., a RIE.

Figure 11:
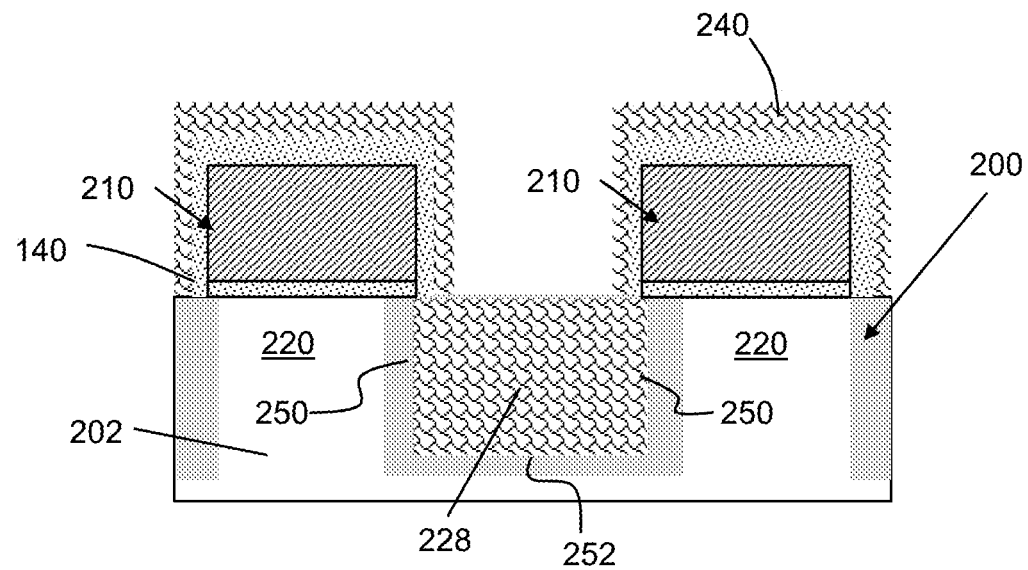
Figure 12:
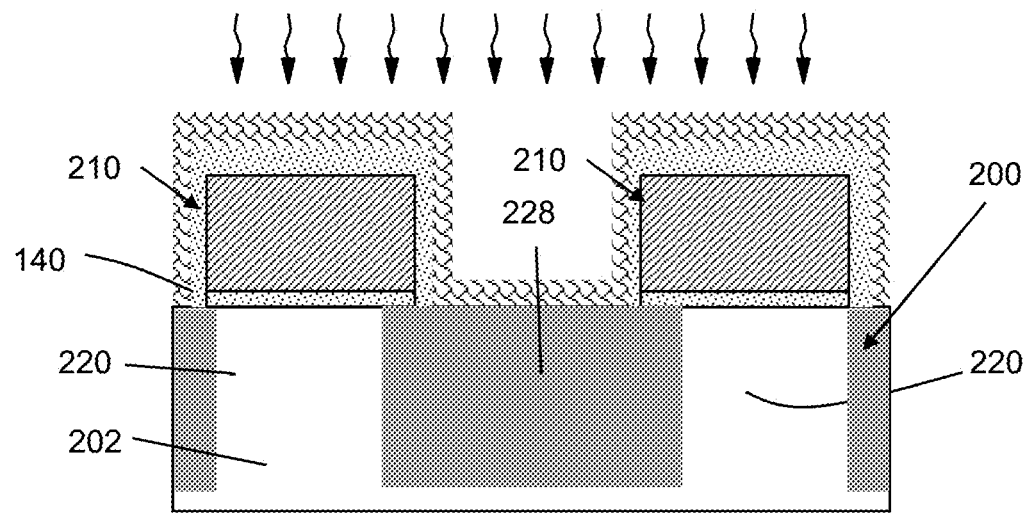

FIG. 11 shows growing a dopant-containing epitaxial layer 240 over the second portion of semiconductor fin 200 adjacent to gate 210, i.e., within recess 226, filling at least part of the section removed from second portion 222 (FIG. 7) in semiconductor fin 200 adjacent to gate 210 to create reformed second portion 228. That is, semiconductor fin 200 is made whole again by replacing the section removed from second portion 222 (FIG. 7) with dopant-containing epitaxial layer 240. The dopant in dopant-containing epitaxial layer 240 may be any dopant described relative to layer 140 in the embodiment shown in FIGS. 5-6. FIG. 12 shows annealing (represented by arrows) to diffuse dopant from dopant-containing epitaxial layer 240 into at least reformed second portion 228 (as replaced and perhaps part of first portions 220) of semiconductor fin 200 adjacent gate 200. Here, the carbon in reformed second portion 228 of semiconductor fin 200, where sidewalls 250 and bottom of recess 252 existed (FIG. 11), adjacent to gate 210 limits diffusion of the dopant into the rest of reformed second portion 228 and perhaps first portion 220 of semiconductor fin 200 adjacent gate 210.

Figure 13:
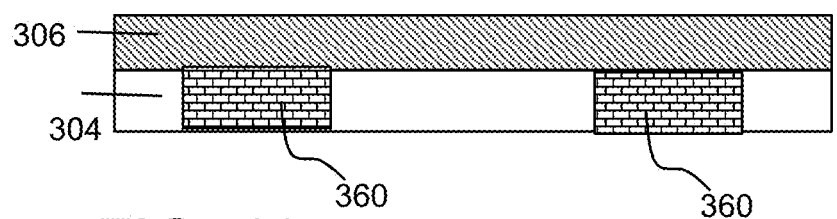
FIGS. 13-16 show cross-sectional views of an alternative method of forming a semiconductor fin according to embodiments of the invention.

FIGS. 13-16 show cross-sectional views of an alternative method of forming a semiconductor fin 300 (FIG. 16) according to embodiments of the invention. FIG. 13 shows epitaxially growing a carbon-doped semiconductor layer 306 on a (bulk) semiconductor substrate 304. Semiconductor substrate 304 may include any semiconductor material listed herein for substrate 104 (FIG. 1). Further, semiconductor substrate 304 may include a plurality of implants 360 therein (e.g., punch through implants formed using, e.g., ion implantation), and optionally may include a cap layer (not shown) thereover, e.g., silicon oxide or silicon nitride. Carbon-doped semiconductor layer 306 may be formed, for example, by epitaxial deposition using hydrogen ($H_2$), silane ($SiH_4$) and methyl-silane ($SiH_3CH_3$). Any cap layer may be removed (e.g., by RIE) prior to epitaxially growing the carbon-doped semiconductor layer 306 on semiconductor substrate 304. In one example, semiconductor layer 306 deposition may occur, for example, at approximately 670° C., 200 Torr for approximately 39 seconds. Epitaxially growing carbon-doped semiconductor layer 306 on semiconductor substrate 304 may include growing the carbon-doped semiconductor layer to a thickness of between approximately 5 nanometers (nm) and approximately 15 nm, and, in one embodiment, to approximately 10 nm. Carbon-doped semiconductor layer 306 may include, for example, approximately 0.1 to approximately 0.4% carbon by atomic weight, e.g., by x-ray photo-electron spectroscopy (XPS) composition.

Figure 14:
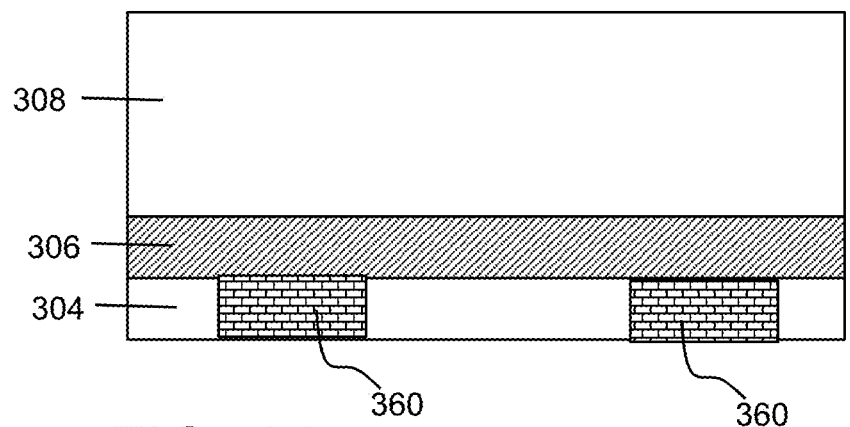
Figure 15:
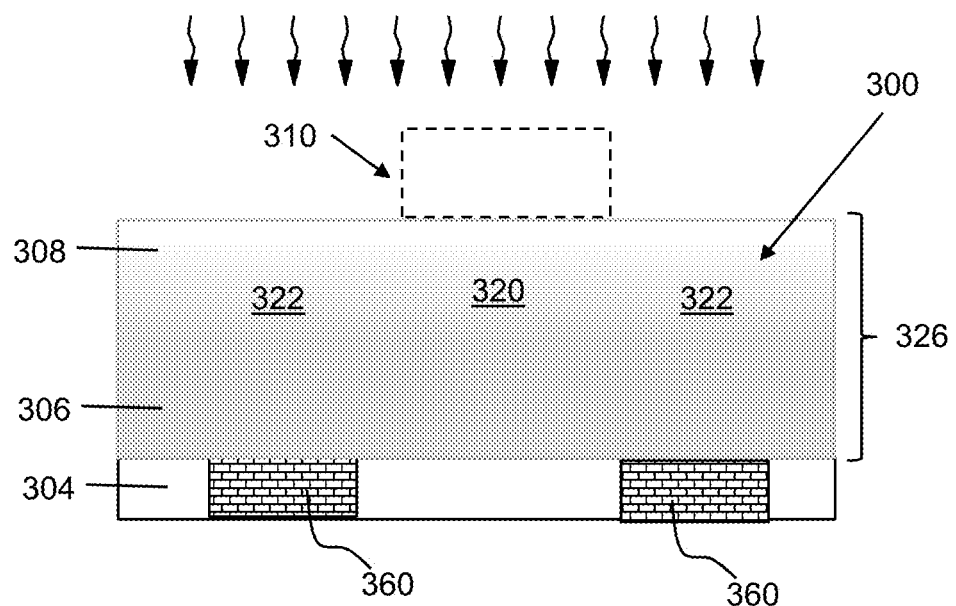

FIG. 14 shows epitaxially growing a semiconductor layer 308 on carbon-doped semiconductor layer 306. This process may include using hydrogen ($H_2$) and silane ($SiH_4$) in an epitaxial deposition chamber. The deposition may occur, for example, at approximately 670° C., 200 Torr for approximately 182 seconds. Epitaxially growing semiconductor layer 308 on carbon-doped semiconductor layer 304 may include growing the layer to a thickness of between approximately 50 nm and approximately 70 nm, and in one example, approximately 60 nm. FIG. 15 shows annealing (represented by arrows) to diffuse carbon dopant from carbon-doped semiconductor layer 306 into semiconductor layer 308, illustrated as enlarging carbon doped semiconductor layer 306 and creating a more homogenous carbon doped semiconductor layer, collectively labeled 326.

Figure 16:
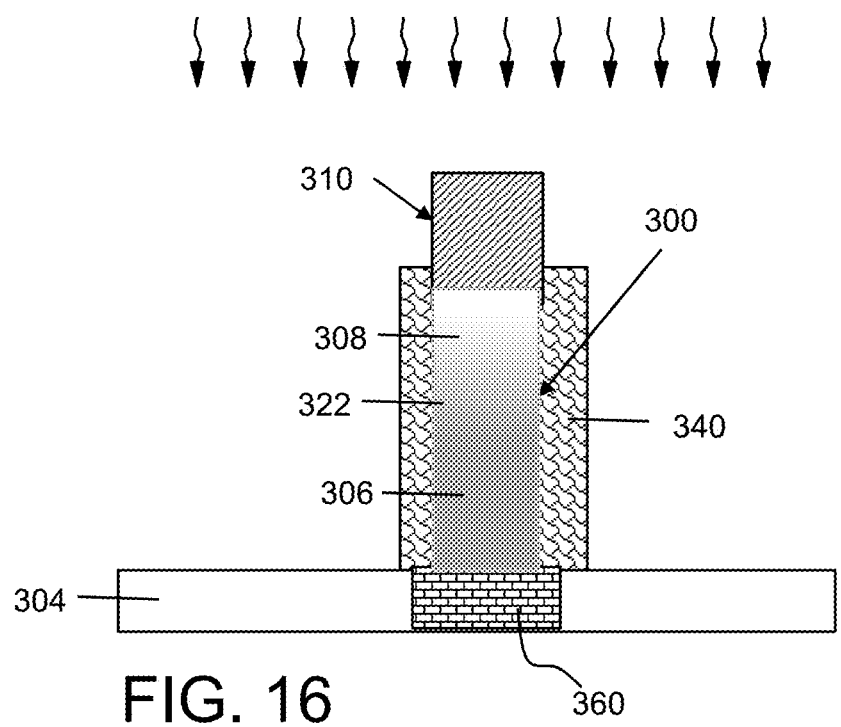

FIGS. 15 and 16 show forming semiconductor fin 300 from carbon doped semiconductor layer 306 on semiconductor substrate 304 and semiconductor layer 308 on carbon-doped semiconductor layer 306, i.e., from combined layer 326. Semiconductor fin 300 can be formed using any photolithographic technique as described herein. Processing hereafter can follow conventional techniques including but not limited to forming a finFET using semiconductor fin 300. Some possible additional steps are shown in FIGS. 15 and 16, including forming a gate 310 (in phantom in FIG. 15) over a first portion 320 (FIG. 15) of semiconductor fin 300. FIG. 16 shows growing a dopant-containing epitaxial layer 340 over a second portion 322 (FIG. 15) of semiconductor fin 300 adjacent to gate 310, and annealing to diffuse dopant from dopant-containing epitaxial layer 340 into at least second portion 322 of semiconductor fin 300 adjacent to gate 310, note change in shading. Epitaxial layer 340 can then be removed, e.g., by RIE.

Once processing according to any of the embodiments of the disclosure has been conducted, finFET processing may be continued according to conventional techniques. For example, where gates 110, 210, 310 are dummy gates, any conventional replacement metal gate processing can be performed to replace them with metal gates. Further, any back-end-of-line processing to isolate devices and/or scale the wiring from the finFET through sequential metal and via layers in interlayer dielectrics may be formed.

Embodiments of the disclosure described herein provide for more uniform carbon doping of a semiconductor fin adjacent to a gate, which provides better control, i.e., limiting, of diffusion of the dopant into at least a portion of the semiconductor fin adjacent the gate from dopant containing epitaxial layers. In addition, embodiments of the disclosure provide this uniform carbon doping for bulk silicon semiconductor fins for which ion implanting carbon was previously impossible. Embodiments of the disclosure provide carbon doping that can be used to modulate short channel effects (SCE) and on resistance ($R_{on}$) by retarding diffusion for both types of FETS. The more controlled carbon doping also has potential leverage for pFETs in controlling drain-induced barrier limiting (DIBL) versus on resistance ($R_{on}$) to increase effective on current ($I_{eff}$).

The method as described above is used in the fabrication of integrated circuit chips. The resulting integrated circuit chips including the herein described semiconductor fins and/or finFETs can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method for controlling dopant diffusion to a semiconductor fin having a first portion, the method comprising:
   depositing a carbon-containing layer over a second portion of the semiconductor fin adjacent to the gate, the second portion distinct from the first portion;
   first annealing to diffuse carbon from the carbon-containing layer into at least the second portion of the semiconductor fin;
   removing the carbon-containing layer over the second portion of the semiconductor fin;
   growing a dopant-containing epitaxial layer over the second portion of the semiconductor fin; and
   second annealing to diffuse dopant from the dopant-containing epitaxial layer into at least the second portion of the semiconductor fin, the carbon in the second portion of the semiconductor fin limiting diffusion of the dopant into at least the second portion of the semiconductor fin.

2. The method of claim 1, wherein the carbon-containing layer includes amorphous carbon.

3. The method of claim 1, wherein the first annealing occurs at a temperature between approximately 600° C. to approximately 1000° C.

4. The method of claim 1, wherein first annealing includes performing one of: a rapid thermal anneal and a laser sintered anneal.

5. The method of claim 1, further comprising depositing a cap layer over the carbon-containing layer after depositing the carbon-containing layer over the second portion of the semiconductor fin, and removing the cap layer prior to removing the carbon-containing layer over the second portion of the semiconductor fin.

6. The method of claim 1, further comprising:
   forming the semiconductor fin from a semiconductor-on-insulator (SOI) layer of a semiconductor-on-insulator (SOI) substrate, the second portion of the semiconductor fin including a cap layer thereover; and
   removing the cap layer from the second portion of the semiconductor fin prior to depositing the carbon-containing layer over the second portion of the semiconductor fin.

7. The method of claim 1, further comprising:
   forming the semiconductor fin from a bulk semiconductor substrate prior to forming the gate over the first portion, the second portion of the semiconductor fin including a cap layer thereover; and
   removing a section of the second portion of the semiconductor fin prior to depositing the carbon-containing layer over the second portion of the semiconductor fin, the removing also removing the cap layer over the second portion of the semiconductor fin, and
   wherein growing the dopant-containing epitaxial layer over the second portion of the semiconductor fin fills at least part of the section removed from the second portion in the semiconductor fin.

8. A method for controlling dopant diffusion to a semiconductor fin having a gate extending over a first portion thereof, the method comprising:
   forming the semiconductor fin from a bulk semiconductor substrate;
   forming the gate over the first portion of the semiconductor fin;
   removing a section of a second portion of the semiconductor fin adjacent to the gate;
   depositing a carbon-containing layer over a remaining section of the second portion of the semiconductor fin adjacent to the gate;
   performing a first annealing to diffuse carbon from the carbon-containing layer into at least the second portion of the semiconductor fin;
   removing the carbon-containing layer over the second portion of the semiconductor fin adjacent to the gate;
   growing a dopant-containing epitaxial layer over the second portion of the semiconductor fin adjacent to the gate, filling at least part of the section removed from the second portion in the semiconductor fin adjacent to the gate; and
   performing a second annealing to diffuse dopant from the dopant-containing epitaxial layer into at least the second portion of the semiconductor fin adjacent the gate, the carbon in the second portion of the semiconductor fin adjacent to the gate limiting diffusion of the dopant into at least the second portion of the semiconductor fin adjacent the gate.

9. The method of claim 8, wherein the carbon-containing layer includes amorphous carbon.

10. The method of claim 8, wherein the first annealing occurs at a temperature between approximately 600° C. to approximately 1000° C.

11. The method of claim 8, wherein first annealing includes performing one of: a rapid thermal anneal and a laser sintered anneal.

12. The method of claim 8, further comprising depositing a cap layer over the carbon-containing layer after depositing the carbon-containing layer over the second portion of the semiconductor fin adjacent to the gate, and removing the cap layer prior to removing the carbon-containing layer over the second portion of the semiconductor fin adjacent to the gate.

13. The method of claim 8, further comprising forming a cap layer over at least the second portion of the semiconductor fin prior to removing the section of the second portion of the semiconductor fin adjacent to the gate, and wherein removing the section of the second portion of the semiconductor fin adjacent to the gate also removes the cap layer over the second portion of the semiconductor fin adjacent to the gate.

14. A method of forming a semiconductor fin, the method comprising:
epitaxially growing a carbon-doped semiconductor layer on a semiconductor substrate;
epitaxially growing a semiconductor layer on the carbon-doped semiconductor layer; and
forming the semiconductor fin from the carbon-doped semiconductor layer on the semiconductor substrate and the semiconductor layer on the carbon-doped semiconductor layer;
forming a gate over a first portion of the semiconductor fin;
growing a dopant-containing epitaxial layer over a second portion of the semiconductor fin adjacent to the gate; and
annealing to diffuse dopant from the dopant-containing epitaxial layer into at least the second portion of the semiconductor fin adjacent the gate, the carbon in the second portion of the semiconductor fin adjacent to the gate limiting diffusion of the dopant into at least the second portion of the semiconductor fin adjacent the gate.

15. The method of claim 14, wherein the semiconductor substrate includes a plurality of implants therein and a cap layer thereover, further comprising removing the cap layer prior to epitaxially growing the carbon-doped semiconductor layer on the semiconductor substrate.

16. The method of claim 14, wherein epitaxially growing the carbon-doped semiconductor layer on the semiconductor substrate includes growing the carbon-doped semiconductor layer to a thickness of between approximately 5 nanometers (nm) and approximately 15 nm; and
wherein epitaxially growing the semiconductor layer on the carbon-doped semiconductor layer includes growing the semiconductor layer to a thickness of between approximately 50 nm and approximately 70 nm.

17. The method of claim 14, wherein the carbon-doped semiconductor layer includes approximately 0.1% to approximately 0.4% carbon by atomic weight.

18. The method of claim 14, further comprising annealing to diffuse carbon dopant from the carbon-doped semiconductor layer into the semiconductor layer.

19. The method of claim 14, further comprising forming a fin-type field effect transistor (finFET) using the semiconductor fin.

* * * * *